(12) United States Patent
Caron et al.

(10) Patent No.: US 9,484,729 B2
(45) Date of Patent: Nov. 1, 2016

(54) ELECTRICAL EQUIPMENT INCLUDING A CONDUCTOR MOUNTING BETWEEN TWO CASING PORTIONS

(71) Applicant: Alstom Technology Ltd., Baden (CH)

(72) Inventors: Adrien Caron, Barberaz (FR); Elodie Laruelle, Aix les Bains (FR); Alexandre Giusti, Aix les Bains (FR); Mathieu Bernard, Aix les Bains (FR); Benjamin Müller, Lenzburg (CH); Lukas Treier, Holziken (CH)

(73) Assignee: ALSTOM TECHNOLOGY LTD, Baden (CH)

( * ) Notice: Subject to any disclaimer, the term of this patent is extended or adjusted under 35 U.S.C. 154(b) by 0 days.

(21) Appl. No.: 14/436,313

(22) PCT Filed: Oct. 21, 2013

(86) PCT No.: PCT/EP2013/071991
§ 371 (c)(1),
(2) Date: Apr. 16, 2015

(87) PCT Pub. No.: WO2014/064056
PCT Pub. Date: May 1, 2014

(65) Prior Publication Data
US 2015/0296647 A1 Oct. 15, 2015

(30) Foreign Application Priority Data
Oct. 22, 2012 (FR) .................................. 12 60027

(51) Int. Cl.
*H05K 5/04* (2006.01)
*H02G 5/06* (2006.01)
*H05K 5/00* (2006.01)
*H05K 5/02* (2006.01)
*H05K 5/06* (2006.01)

(52) U.S. Cl.
CPC .............. *H02G 5/068* (2013.01); *H02G 5/063* (2013.01); *H05K 5/0004* (2013.01); *H05K 5/0247* (2013.01); *H05K 5/061* (2013.01)

(58) Field of Classification Search
CPC ...... H05K 5/06; H05K 5/061; H05K 5/0247; H05K 5/004; H02G 5/068; H02G 5/066; H02G 5/063; H02B 13/045; H02B 13/035; H01B 17/301; H01B 17/26; H01B 17/265
USPC .......... 174/28, 124, 137 R, 138 R, 168, 142, 174/154, 22 C, 30; 333/245; 361/618
See application file for complete search history.

(56) References Cited

U.S. PATENT DOCUMENTS 3,372,226 A   3/1968  Sewell
4,496,789 A * 1/1985  Itaka ...................... H02G 5/068
                                                    174/22 C (Continued)

FOREIGN PATENT DOCUMENTS

EP       2 086 081 A1   8/2009

OTHER PUBLICATIONS

Search Report issued in French Patent Application No. FR 12 60027 dated Aug. 7, 2013.
International Search Report issued in Application No. PCT/EP2013/071991 dated Nov. 22, 2013.
Written Opinion issued in Application No. PCT/EP2013/071991 dated Nov. 22, 2013.

*Primary Examiner* — Dimary Lopez Cruz
(74) *Attorney, Agent, or Firm* — Pearne & Gordon LLP

(57) ABSTRACT

An insulating support (20) for insulating an electrical conductor contained in aligned casing portions (34, 35), is held in a housing (39) defined by the flanges (36, 37) for joining the casing portions (34, 35) together, the flanges presenting contact faces (38) around the periphery (24) of the support (20). A single sealing gasket (41) is sufficient to prevent the atmosphere in the casing leaking to the outside, and that simplifies assembly of the electrical equipment, while at the same time protecting the support (20) from the outside. For application to medium- and high-voltage electrical equipment.

10 Claims, 5 Drawing Sheets

(56) References Cited

U.S. PATENT DOCUMENTS

| | | | | |
|---|---|---|---|---|
| 5,723,814 | A * | 3/1998 | Kolbl | H02G 5/068 174/151 |
| 7,795,541 | B2 * | 9/2010 | Hiltbrunner | H02G 5/066 16/2.1 |
| 8,124,874 | B2 * | 2/2012 | Blatter | H02G 5/068 174/139 |
| 8,191,901 | B2 * | 6/2012 | Crawford | F16L 19/0218 277/608 |
| 8,552,297 | B2 * | 10/2013 | Sologuren-Sanchez | H02G 5/068 174/137 R |
| 2002/0153352 | A1 | 10/2002 | Aoyagi | |
| 2002/0158721 | A1 * | 10/2002 | Plummer | H01P 1/045 333/245 |

* cited by examiner

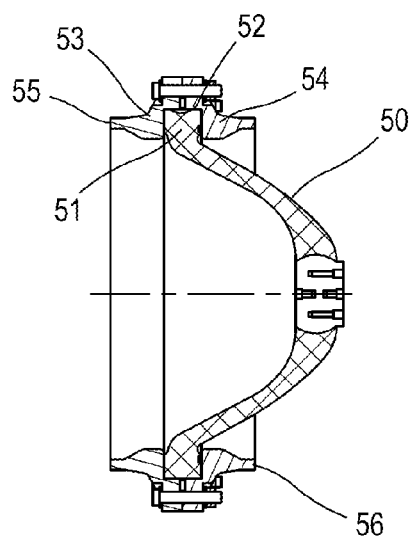
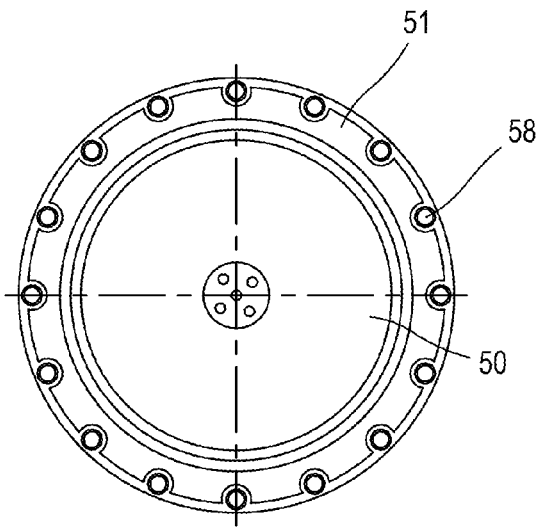
FIG. 6  FIG. 7
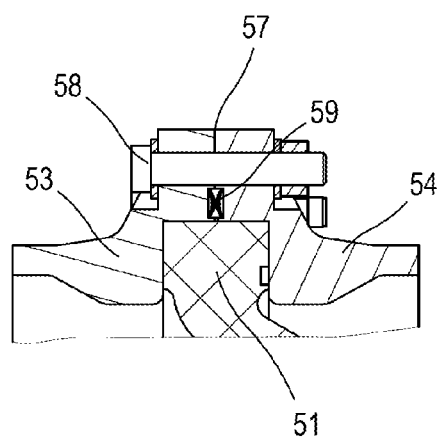
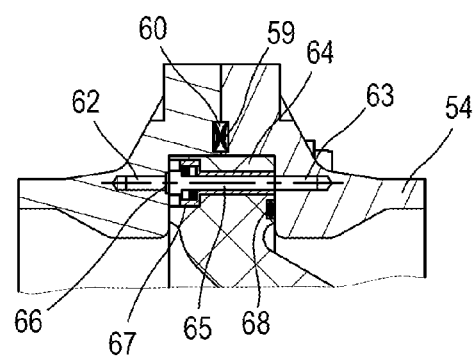
FIG. 8  FIG. 9

ELECTRICAL EQUIPMENT INCLUDING A CONDUCTOR MOUNTING BETWEEN TWO CASING PORTIONS

The present invention relates to electrical equipment including a support for supporting a conductor between two portions of casing.

Such electrical equipment may belong to a high- or medium-voltage network in which the conductors are surrounded by casings having an important function of enabling a particular dielectric atmosphere to be maintained, conventionally sulfur hexafluoride ($SF_6$), although other gases are presently used for the same purpose.

The conductors are held at the centers of the casings by supports of disk or cone shape, with their outer edges pressing against the wall of the casing. In practice, the casings are constituted by portions that are assembled together and that are very often of cylindrical shape, with the linear portions of the conductors extending along the axes of the casings. The insulating supports may then be placed at the junctions between two assembled-together portions of the casing.

In a great number of designs, shown in particular by document EP-A-2 086 081, the insulating support extends between the assembly flanges of the casing portions so as to separate them completely from each other. Metal bushings are placed around the assembly bolts of the flanges, in such a manner as to act as spacers and avoid the support collapsing due to the bolts being tightened, the support generally being of low mechanical strength. The need to add bushings complicates assembly and adds to the expense; leaktightness against the outside must be provided on both sides of the support by gaskets clamped against the respective flanges, with the same drawback of complication; exposing the edge of the support to the outside of the electrical equipment is generally unfavorable, since it may be exposed to various forms of damage; and the discontinuity between the casing portions prevents electric return currents from flowing efficiently therethrough. Those last two drawbacks may be eliminated by adding sleeves around the flanges, which sleeves therefore contribute to connecting them together while covering the edge of the support, but the electrical equipment is further complicated thereby.

Figure 1:
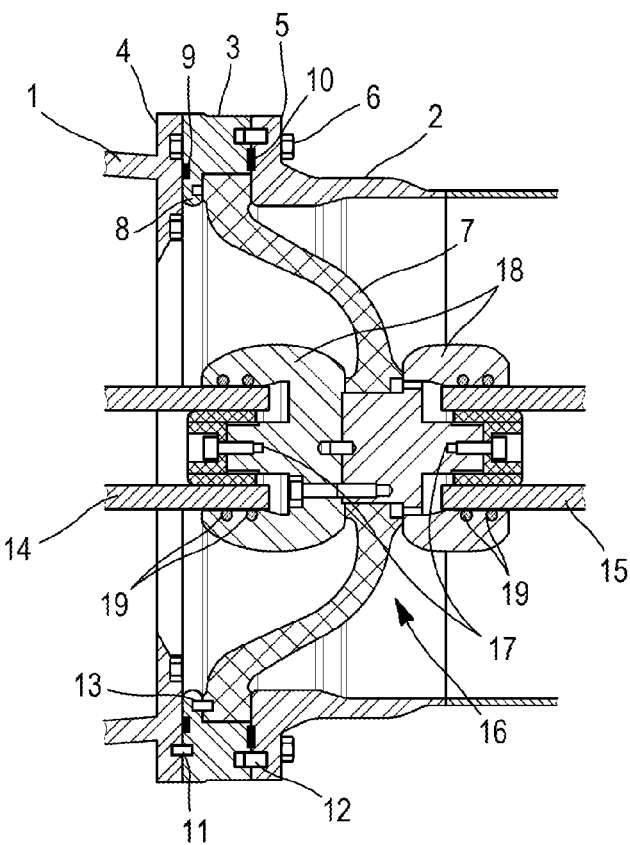

In another type of design, an embodiment of which is shown in FIG. 1, the casing portions 1 and 2, in alignment, are separated by a part referred to as a "ring flange" 3 that extends between the assembly flanges 4 and 5. Assembly bolts 6 of the electrical equipment pass through the ring flange 3 and clamp it between the flanges 4 and 5. The insulating support 7 is surrounded by a main portion of the ring flange 3, and is retained in an axial direction of the electrical equipment between one of the flanges 5 and an inner radial lip 8 of the ring flange 3. Two sealing gaskets 9 and 10 are compressed between the ring flange 3 and the respective flanges 4 and 5, so as to establish sealing relative to the outside and to thus prevent the dielectric gas from leaking. Pegs 11, 12, and 13 are placed between the ring flange 3, and respectively the flanges 1, 2 and the edge of the support 7, in such a manner as to hold all of those parts in an invariable angular position. In that particular embodiment, the overall conductor is made up of two linear and autonomous conductors 14 and 15, respectively contained by the portions 1 and 2, and of a coupling 16 attached to the support 7, passing through it at its center, and comprising on each side an endpiece 17, about which the ends of the conductors 14 and 15 are pressed, a corona shield 18 surrounding the endpiece 17 and said conductors 14 and 15 when they are in place, and contact springs 19 projecting from the insides of the cylindrical corona shields 18 so as to hold the ends of the conductors 14 and 15 and thus enhance electrical conduction.

The ring flange 3 provides better cohesion for the assembly and makes it possible in particular to hold the support 7 well in spite of the mechanical, thermal, and electromagnetic stresses to which is it subjected, while protecting it from the outside; the drawbacks of that design however are, once more, a certain amount of complication of the assembly due to the addition of the ring flange 3, and the presence of two sealing gaskets 9 and 10 on the opposite plane faces of the ring flange. Other drawbacks of the embodiment of FIG. 1 are that coupling of the conductor portions is also complicated, having the same consequence of high cost for the electrical equipment due to the large number of parts used, and also electrical losses because of poor contact at the two couplings of the conductor.

Other apparatus are the subject-matter of documents US-2002/158 721-A, US-2002/153 352-A and U.S. Pat. No. 3,372,226-A, in, which the insulating support is directly retained in recesses created by the two assembly flanges, without the use of a ring flange.

This design makes it possible to greatly simplify assembly, by eliminating the ring flange or the spacer bushings. The insulating support remains well protected from the outside and well held by the flanges. A single sealing gasket is sufficient, which further contributes to simplifying assembly, while reducing the risk of gas passing between the inside and the outside of the casing, since a single interface exists along the length of the casing. There is great freedom of design for the electrical equipment as a result of the portions performing sealing and the portions holding the insulating support on the flanges being separate when the gasket is completely separate from the periphery of the insulating support.

Here an electrical equipment is proposed, comprising, as above, two portions of a casing for at least one electrical conductor, an insulating support through which the conductor passes and pressing against the casing, the portions of the casing being joined by flanges and the insulating support having a periphery that is housed between the flanges; the flanges have faces that are in contact, and in that a sealing gasket is compressed between said faces and surrounds the periphery. The flanges comprise planar and parallel faces between which the peripheral portion is contained, and circular faces extending each other and which surround the peripheral portion. And the apparatus is original in that the support comprises a collar on an outer edge and a collar on an essentially planar face, the peripheral portion is contained in a recess of the flange with a clearance, except at the collars, which are respectively bearing on the circular face of one of the collars and the planar face of one of the flanges.

The projecting collars, bearing against at least one of the plane and parallel faces and at least one of the circular faces of the flanges, cause the support to rest on the face or faces in question having reduced thickness. If mounting or thermal expansion leads to compression of the support, it is absorbed by deformation of the collars, without leading to large stresses in the main portion of the support. Such collars may therefore extend over the side faces of the support or its outside face, in such a manner as to help abutment being either in the axial direction, or else in the radial direction of the electrical equipment.

The differential thermal expansions to which the support is subjected therefore do not produce large mechanical stresses thereon.

The projecting collars may have a gas passing channel or channels cut therein, so that a dielectric atmosphere of the same composition extends throughout the electrical equipment and in particular into all of the interstices between the periphery of the support and the flanges.

The invention is indeed compatible with supports of simplified shape having thickness that is essentially uniform in a main portion extending from the periphery towards a central region of the support, the periphery being of thickness that is not less than that of the main portion. In this particular embodiment, the support may in particular be a disk of thickness that is essentially constant over its entire extent; a thickness that is greater at the periphery may however be envisaged in order to reinforce the support at this periphery in which it is embedded and may therefore be subjected to greater loads.

The electrical equipment of the invention may favorably be used with a three-phase network, including three conductors contained in a common casing and extending parallel to one another, through the insulating support; said support is thus often in the shape of a disk.

The flanges and the casing portions are, in general, joined together by a circle of bolts, as is conventional, but without having to use spacer bushing or other parts, since the flanges are clamped together directly; however, it is possible to add means for fastening the insulating support to one of the casing portions so as to increase cohesion of the electrical equipment both before assembly and after it has been assembled. Such fastener means may comprise screws engaged through the periphery and in tapped holes established beyond the plane face of one of the flanges. Moderate tightening may be applied to these screws instead of the strong tightening used for assembling the flanges together. The support may thus include metal bushings in which the screws are engaged, with screw heads pressing against the bushing, in such a manner that the clamping force is exerted on the bushing, but not on the insulating support itself.

It is mentioned above that one of the advantages of the invention is to provide a saving of one sealing gasket relative to prior designs. Despite that, it is possible to add a second sealing gasket, compressed between the periphery of the insulating support and one of the plane faces of the flanges, so as to separate the atmospheres of the two compartments of the casing separated by the support.

In another kind of improvement, the conductor comprises a coupling that is secured to the support, a first length extending in one of the casing portions and joined to the coupling in removable manner by being engaged in a concave side of a corona shield belonging to the coupling and including a spring situated in the concave side of the corona shield, and a second length extending in the other casing portion and joined to the coupling by being fastened thereto. It is thus also possible to simplify the conductor of the electrical equipment, while at the same time increasing its cohesion, by replacing one of the couplings by insertion of the embodiment of FIG. 1 with a fastener, and to further reduce the smaller electrical losses by means of a fastener coupling.

Figure 2:
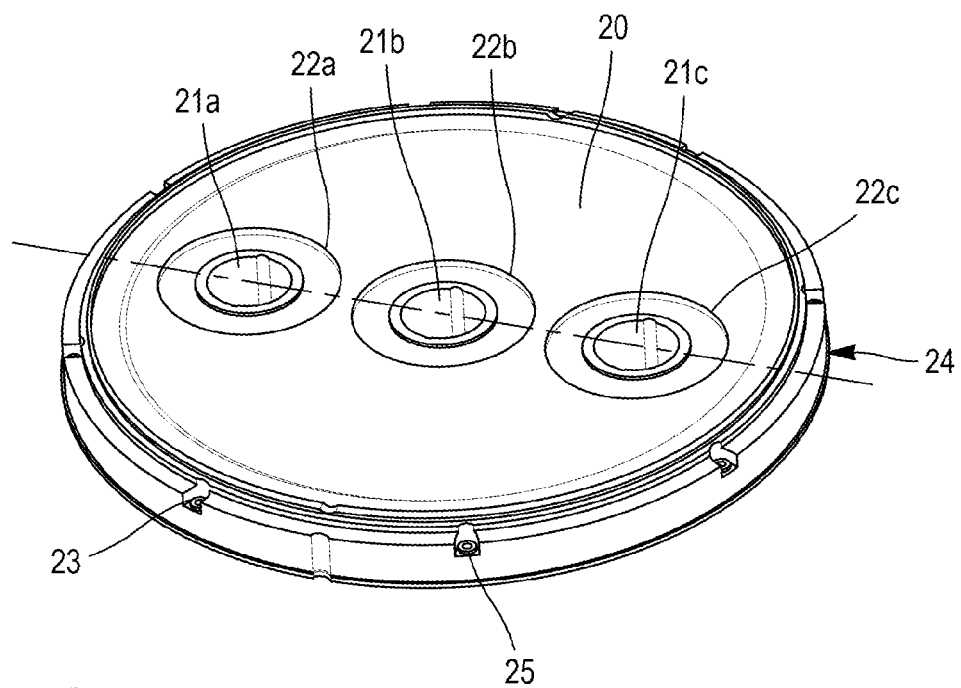
Figure 3:
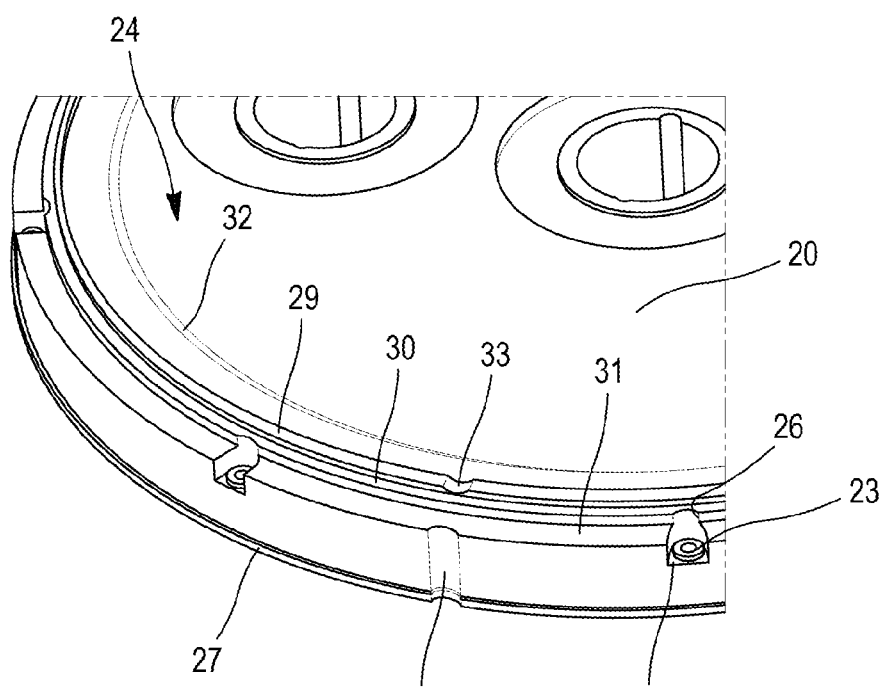

A more detailed description of the invention is given below by means of a few purely illustrative embodiments and of the accompanying figures:

FIG. 1, described above, shows electrical equipment comprising a conventional coupling of flanges and conductors;

FIGS. 2 to 5 show a first embodiment of the invention, FIG. 2 showing the insulating support;

FIG. 3 showing a detail of said support; and

Figure 4:
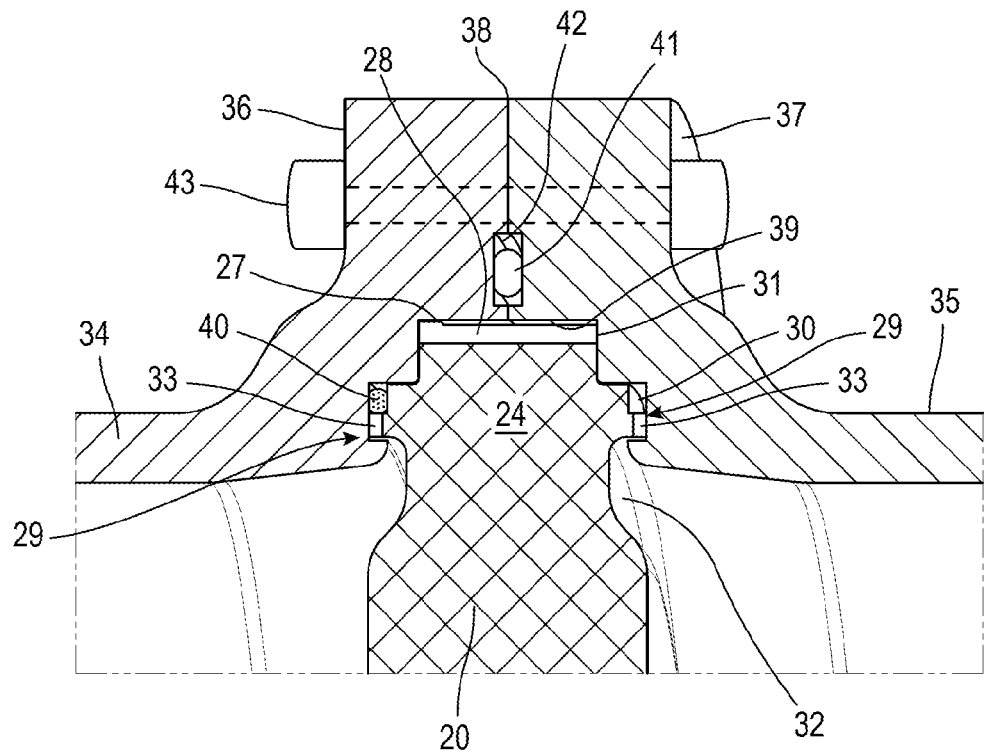
Figure 5:
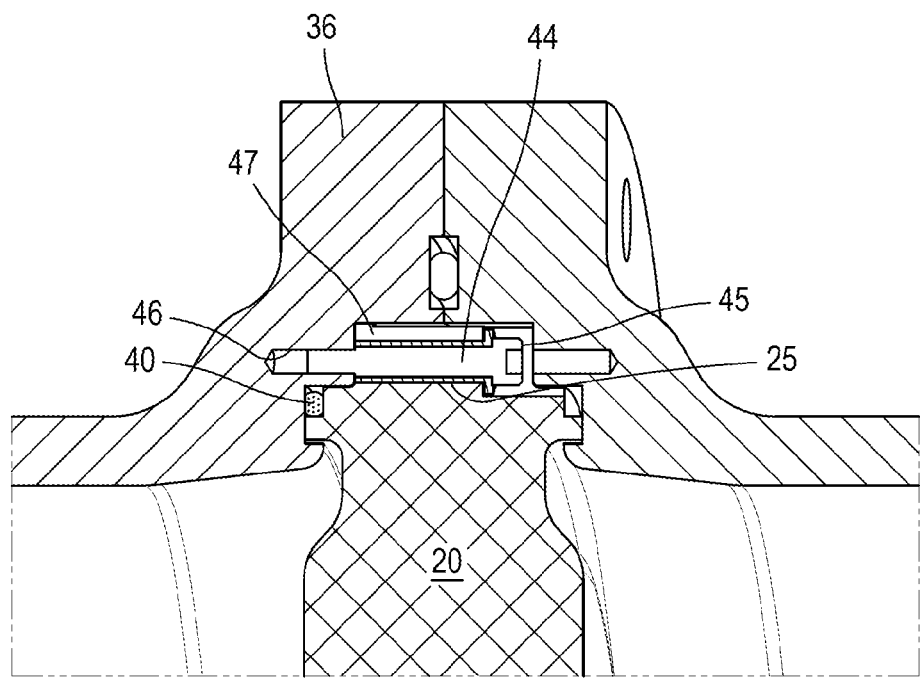

FIGS. 4 and 5 showing two views of the periphery of the support housed between the flanges;

FIGS. 6 to 9 show another embodiment of the equipment, FIG. 6 being a general view of the electrical equipment in section;

FIG. 7 being a view in cross section;

FIG. 8 being a detail of FIG. 6; and

Figure 10:
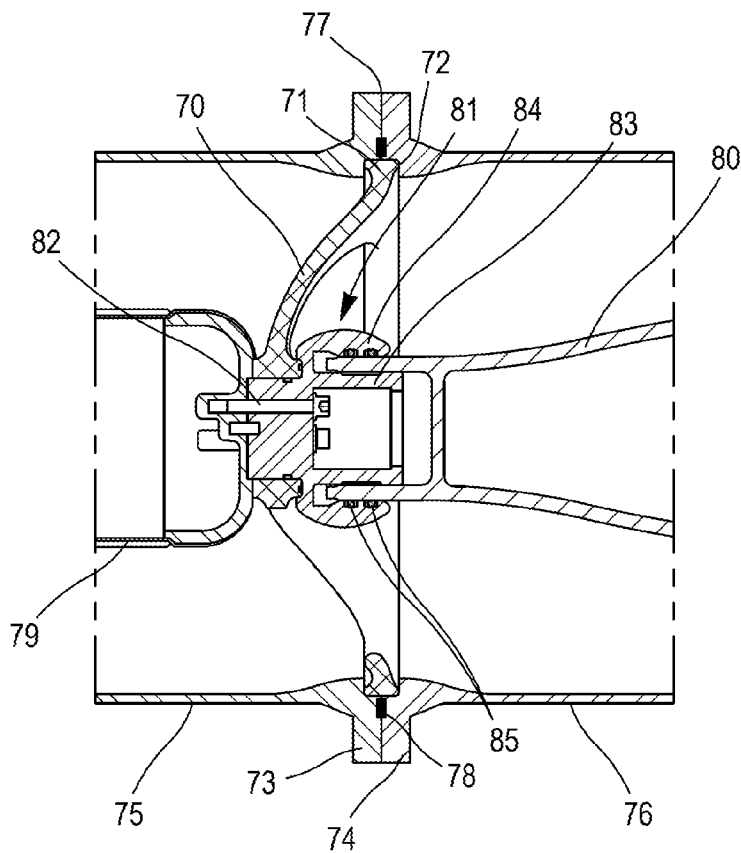
Figure 11:
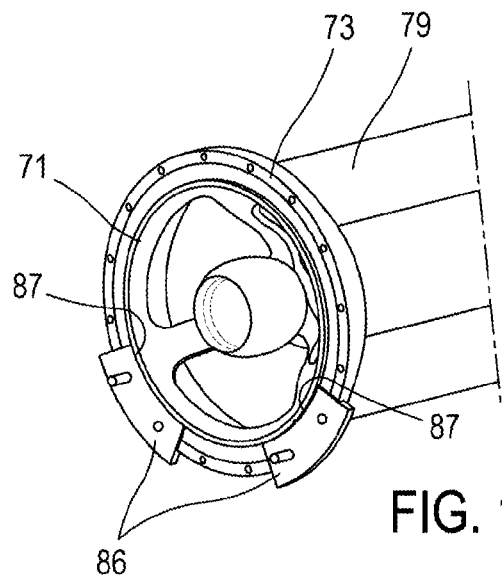
Figure 12:
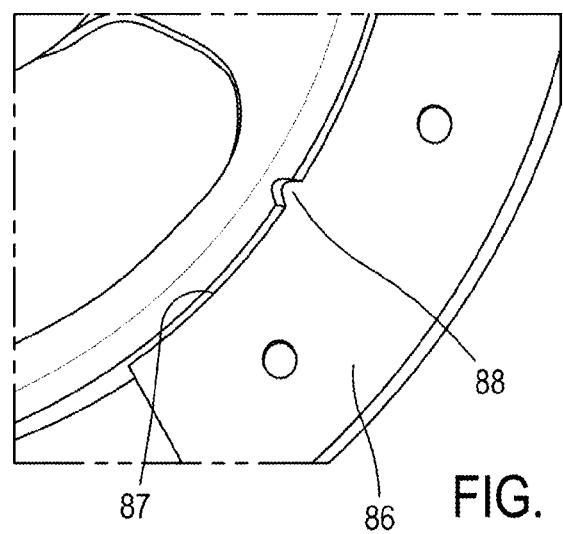

FIG. 9 being a detail of the periphery of the insulating support and of its surroundings, in another angular position that is different from FIG. 8; and FIGS. 10, 11, and 12 show another embodiment of the equipment.

FIGS. 2 to 5 are described below. This embodiment of the insulating support, now referenced 20, is in the form of a disk and includes three holes 21a, 21b, and 21c, aligned on a diameter in order to allow three conductors of a three-phase network to pass therethrough. The insulating support 20 may be constructed in accordance with the rules given in above-mentioned document EP-A-2 086 081, and may in particular have two essentially plane faces and thickness that is more or less uniform over its entire extent, shallow cavities 22a, 22b, and 22c however being made around the holes 21a, 21b, and 21c.

Other holes, all given the reference 23, extend in the periphery 24 of the support 20; there are eight of them and they are uniformly distributed angularly; each of them contains a bushing 25. Respective recesses 26 are made in front of them in one of the plane faces of the support.

The outside edge of the support 20 includes a collar 27 of small height and small thickness, and at least one channel 28 cut into the outside face of the periphery 24 and passing through said collar 27. The essentially plane faces of the support 20 also include irregularities in shape at the periphery 24 and close to the periphery, namely an annular cavity 32, then a collar 29, a first step 30, and a second step 31, on going radially outwards. The collar 29 also has a channel 33 cut therein that extends in a radial direction. The annular cavity 32 is established for the reasons given in the above-mentioned document EP-A-2 086 081. Below, a description of the electrical equipment itself is given, and more precisely a description of how it is assembled to the casing.

The aligned casing portions 34 and 35 have flanges 36 and 37 with contact faces that meet at an interface 38 surrounding the insulating support 20. The flanges 36 and 37 define a housing 39 that is surrounded by the interface 38 and that receives the periphery 24, generally with a small amount of clearance; nevertheless, the collars 27 and 29 press respectively against one of the circular aligned faces of the flanges 36 and 37, and against the plane and parallel faces of said flanges, which define the housing 39. A sealing gasket 40 is present in the first step 30 of one of the support faces 20, so as to establish sealing between the two compartments of the casing separated by the support 20 when sealing is necessary. Nevertheless, the channels 28 and 33 make it possible for the dielectric atmosphere of the two compartments to reach the two opposite sides of the gasket 40 and thus occupy all of the interstices in the casing.

A main sealing gasket 41 is established in the grooves hollowed out in the faces in contact with the flanges 36 and 37 so as to avoid gas passing between the inside and the outside of the electrical equipment. With the design of FIG. 1, there exists a single path for potential leaks to the outside, which path is via the interface 38, and the single gasket 40 suffices to block that path.

The bolts 43 for clamping the flanges 36 and 37 together are distributed around the gasket 41. FIG. 5 shows that screws 44 are placed in the holes 23 and the bushings 25;

their heads 45 press against the ends of said bushings 25, which rest on the plane face 47 of one of the flanges 36 defining the housing 39; and the screws 44 penetrate into the tapped holes 46 established beyond said plane face 47. By moderately tightening the screws 44, the support 20 becomes blocked on the flange 36, and that facilitates assembly of the electrical equipment and subsequently increases cohesion. In addition, the sealing gasket 40 is retained from the start, since it is on the same side as the tapped holes 46.

A second embodiment of the equipment is described below, with reference to FIGS. 6 to 9. In this embodiment, the insulating support 50 is in the shape of a cone. Its periphery 51 is likewise engaged in a housing 52, established between two flanges 53 and 54 of two in-line casing portions 55 and 56. The flanges 53 and 54 further include faces making contact at an interface 57, and they are clamped together by bolts 58 distributed in a circle. A sealing gasket 59 is housed in a groove 60, provided in the contacting faces; it is surrounded by the circle of bolts 58, and it surrounds the periphery 51 of the support 50. The gasket 59 may be a gasket having lobes (butterfly section) or it may be made up of two O-rings. This embodiment likewise has a single path for potential leaks, and that simplifies assembly even if a plurality of gaskets are used, which is not essential.

FIG. 7 shows that the periphery 51 may be indented at the bolts 58 and projecting elsewhere, in such a manner as to surround the bolts 58 in part.

The flanges 53 and 54 are provided with tapped holes 62 and that extend beyond the facing plane faces defining the housing 52. The periphery 51 is provided with holes in which bushings 64 are installed. Screws 65 ensure that the support 50 is held in place on one of the flanges, in this example the flange 54, by being engaged in the corresponding tapped holes (in this example 63). The screw heads 66 press against the bushings 64 via lock washers 67 that prevent loosening. A groove is hollowed out in the face of the periphery 51 that bears against the flange 54, in order to receive a second toroidal sealing gasket 68, that provides further sealing between compartments of the casing separated by the support 50. In this embodiment, the support 50 may be held on either one of the flanges 53 and 54 on condition that it is turned to face the other way.

Another equipment is described below with reference to FIGS. 10 to 12. The figures show an insulating support 70, of conical shape, having a thicker periphery 61, held in an annular housing 72, defined by flanges 73 and 74 of two casing portions 75 and 76, and that likewise presents a contact interface 77, a gasket 78 likewise establishing sealing at the interface 77 and surrounding the periphery 71.

The description below is about electrical coupling. Each of the compartments defined by the casing portions 75 and 76 contains a respective linear conductor 79 or 81, which conductors are joined by a coupling 81 that is also conductive and that is attached to the support 70. In this embodiment, one of the conductors 79 is fastened by screws 82 to the coupling 81, whereas the other conductor 80 is engaged about an endpiece of the coupling 81, in freely detachable manner, the connection being finished off by a corona shield 84, surrounding the conductor 80 and provided with contact springs 85 provided in the concave side of the corona shield 84, which springs establish clamping and promote conduction through the coupling 81 when the conductor 80 is engaged into said concave side.

This embodiment is original compared with that shown in FIG. 1 in that the coupling 81 and the support 70 are both attached to the conductor 79 and are therefore held more firmly. It should also be emphasized that the support 70 is held in place even when the flanges 73 and 74 are separated, that the number of electrical coupling parts is small, and that making a connection by fastening is accompanied by electrical losses that are smaller than for a connection made by mutual engagement and holding with contact springs 85: the device is therefore both less costly and better at conducting electricity.

It is possible to organize tooling in order to facilitate transportation and assembly of the device. FIG. 11 shows that said tooling consists of collars 86 for bolting to the flange 73 of the conductor 79 when it is not assembled to the other flange 74. The collars 86 include respective edges 87 for supporting the periphery 71 of the support 70, and that, as shown in FIG. 12, can be provided with lugs 88 engaged in corresponding notches of the periphery 71 and thus prevent the periphery from turning.

It is evident that other embodiments of the invention are possible, for example, the above-described embodiments may be combined with one another.

What is claimed is:

1. Electrical equipment comprising two portions of a casing for at least one electrical conductor, an insulating support for the conductor through which the conductor passes and which bears against the casing, wherein flanges extend from each of the portions of the casing and the portions of the casing being joined by the flanges and the insulating support having a peripheral portion that is housed between the flanges; the flanges having faces that are in contact, and a sealing gasket being compressed between said faces and surrounding the peripheral portion; the flanges have parallel plane faces between which the peripheral portion is housed and circular faces which are cylindrical-in-shape extending from each other and surrounding the peripheral portion, wherein the support comprises a collar on an outer edge, said collar projecting in a radially outward direction and a collar on an essentially planar face, the flanges define a housing that receives the peripheral portion is housed in a housing of the flanges with a clearance, except at the collars, which respectively bear against the circular face of one of the flanges and the parallel planar face of one of the flanges.

2. Electrical equipment according to claim 1, wherein at least one of the collar on the outer edge and the collar on the essentially planar face has at least one gas passing channel cut therein.

3. Electrical equipment according to claim 1, wherein the support is of thickness that is essentially uniform in a main portion extending from the peripheral portion towards a central region of the support, the peripheral portion having a thickness that is not less than that of the main portion.

4. Electrical equipment according to claim 3, wherein the support is a disk of thickness that is essentially constant.

5. Electrical equipment according to claim 4, wherein the electrical equipment is three-phase electrical equipment and includes three electrical conductors extending in parallel.

6. Electrical equipment according to claim 3, further comprising means for fastening the support to one of the casing portions.

7. Electrical equipment according to claim 6, wherein the fastener means comprise screws engaged through the peripheral portion and in tapped holes established beyond the plane face of the flange of said one of the casing portions.

8. Electrical equipment according to claim 7, wherein the support includes metal bushings in which the screws are engaged, with screw heads pressing against the bushing.

9. Electrical equipment according to claim 1, further comprising another sealing gasket, compressed between the peripheral portion and one of the plane faces of the flanges.

10. Electrical equipment according to claim 1, wherein the conductor comprises a coupling that is secured to the support, a first linear conductor extending in one of the casing portions and joined to the coupling in removable manner by being engaged in a concave side of a corona shield belonging to the coupling and including a spring situated in the concave side of the corona shield, and a second linear conductor extending in the other casing portion and joined to the coupling by being fastened thereto.

\* \* \* \* \*